(12) United States Patent  (10) Patent No.: US 9,171,818 B2
Chen et al.  (45) Date of Patent: Oct. 27, 2015

(54) PACKAGE STRUCTURE AND THE METHOD TO MANUFACTURE THEREOF

(75) Inventors: Da-Jung Chen, Taoyuan County (TW); Wen-Hsiung Liao, Hsinchu County (TW); Chun-Fu Hu, Yilan County (TW)

(73) Assignee: CYNTEC Co., Ltd., Hsinchu (TW)

(\*) Notice: Subject to any disclaimer, the term of this patent is extended or adjusted under 35 U.S.C. 154(b) by 323 days.

(21) Appl. No.: 13/323,843

(22) Filed: Dec. 13, 2011

(65) Prior Publication Data

US 2013/0146341 A1  Jun. 13, 2013

(51) Int. Cl.
*H05K 1/16* (2006.01)
*H01L 23/00* (2006.01)
(Continued)

(52) U.S. Cl.
CPC .............. *H01L 24/32* (2013.01); *H01L 23/498* (2013.01); *H01L 24/16* (2013.01); *H01L 24/81* (2013.01); *H01L 24/83* (2013.01); *H01L 23/3121* (2013.01); *H01L 24/13* (2013.01); *H01L 24/29* (2013.01); *H01L 2224/0401* (2013.01); *H01L 2224/04026* (2013.01); *H01L 2224/0556* (2013.01); *H01L 2224/06181* (2013.01); *H01L 2224/13111* (2013.01); *H01L 2224/13116* (2013.01); *H01L 2224/13139* (2013.01); *H01L 2224/13147* (2013.01); *H01L 2224/16245* (2013.01); *H01L 2224/16505* (2013.01); *H01L 2224/16507* (2013.01); *H01L 2224/2902* (2013.01); *H01L 2224/29034* (2013.01); *H01L 2224/29111* (2013.01); *H01L 2224/29116* (2013.01); *H01L 2224/29118* (2013.01); *H01L 2224/29139* (2013.01); *H01L 2224/30181* (2013.01); *H01L 2224/32225* (2013.01); *H01L 2224/32505* (2013.01);

(Continued)

(58) Field of Classification Search
CPC .................... H05K 3/3452; H01L 2924/3011; H01L 24/32; H01L 23/498; H01L 24/16; H01L 24/81; H01L 24/83; H01L 23/3121; H01L 24/13; H01L 24/29; H01L 2224/0401; H01L 2224/04026; H01L 2224/0556; H01L 2224/06181; H01L 2224/1311; H01L 2224/13116; H01L 2224/13139; H01L 2224/13147; H01L 2224/16245; H01L 2224/16505; H01L 2224/16507; H01L 2224/2902; H01L 2224/29034; H01L 2224/29111; H01L 2224/29116; H01L 2224/29118; H01L 2224/29139; H01L 2224/3018; Y10T 29/49155
USPC .................. 174/260–263; 257/678, 772, 787, 257/E23.01, 528, 532; 361/411, 760, 761, 361/306.1, 308.1, 777, 792–795; 148/24
See application file for complete search history.

(56) References Cited

U.S. PATENT DOCUMENTS 3,381,081 A \* 4/1968 Schalliol ........................ 174/260
5,574,629 A \* 11/1996 Sullivan ........................ 361/767

(Continued)

*Primary Examiner* — Jenny L Wagner
*Assistant Examiner* — Pete Lee
(74) *Attorney, Agent, or Firm* — Min-Lee Teng; Litron Patent & Trademark Office (57) ABSTRACT

The invention discloses a package structure with an overlaying metallic material overlaying a solder material. A substrate comprises a first solder pad and a second solder pad thereon. A conductive element on the substrate comprises a first electrode and a second electrode thereon. A solder material electrically connects the first solder pad and the second solder pad to the first electrode and the second electrode respectively. An overlaying metallic material overlays the exposed areas of the solder metallic material, the first solder pad, the second solder pad, the first electrode and the second electrode, wherein the exposed areas comprise metallic material having a lower melting point than the second metallic material.

12 Claims, 6 Drawing Sheets

(51) Int. Cl.
*H01L 23/498* (2006.01)
*H01L 23/31* (2006.01)

(52) U.S. Cl.
CPC ............... *H01L 2224/32507* (2013.01); *H01L 2224/8192* (2013.01); *H01L 2224/81815* (2013.01); *H01L 2224/8392* (2013.01); *H01L 2224/83411* (2013.01); *H01L 2224/83416* (2013.01); *H01L 2224/83418* (2013.01); *H01L 2224/83439* (2013.01); *H01L 2224/83815* (2013.01); *H01L 2924/00014* (2013.01); *H01L 2924/01322* (2013.01); *H01L 2924/1305* (2013.01); *H01L 2924/1306* (2013.01); *H01L 2924/13055* (2013.01); *H01L 2924/13091* (2013.01); *Y10T 29/49155* (2015.01)

(56) References Cited

U.S. PATENT DOCUMENTS

| | | | | |
|---|---|---|---|---|
| 6,521,997 | B1 * | 2/2003 | Huang et al. | 257/737 |
| 6,903,920 | B1 * | 6/2005 | Prymak | 361/321.2 |
| 7,268,415 | B2 * | 9/2007 | Abbott et al. | 257/666 |
| 7,312,403 | B2 * | 12/2007 | Yamamoto | 174/260 |
| 7,390,698 | B2 * | 6/2008 | Thornton et al. | 438/106 |
| 7,965,169 | B2 * | 6/2011 | Szwarc et al. | 338/22 R |
| 2007/0216003 | A1 * | 9/2007 | Chen et al. | 257/678 |
| 2007/0216039 | A1 * | 9/2007 | Arai et al. | 257/787 |
| 2008/0102561 | A1 * | 5/2008 | Goto et al. | 438/106 |
| 2009/0116203 | A1 * | 5/2009 | Matsuno et al. | 361/760 |

* cited by examiner

PACKAGE STRUCTURE AND THE METHOD TO MANUFACTURE THEREOF

BACKGROUND OF THE INVENTION

I. Field of the Invention

The present invention relates to a package structure, and in particularly to a package structure with an overlaying metallic material over a solder material.

II. Description of the Prior Art

Figure 1A:
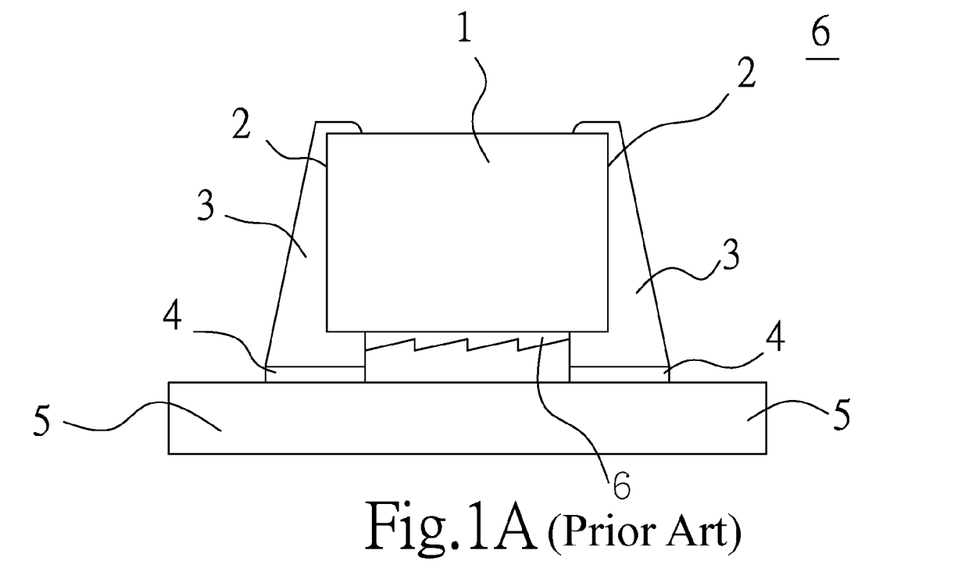
FIG. 1A illustrates a perspective view of Sn bridging issue.
Figure 1B:
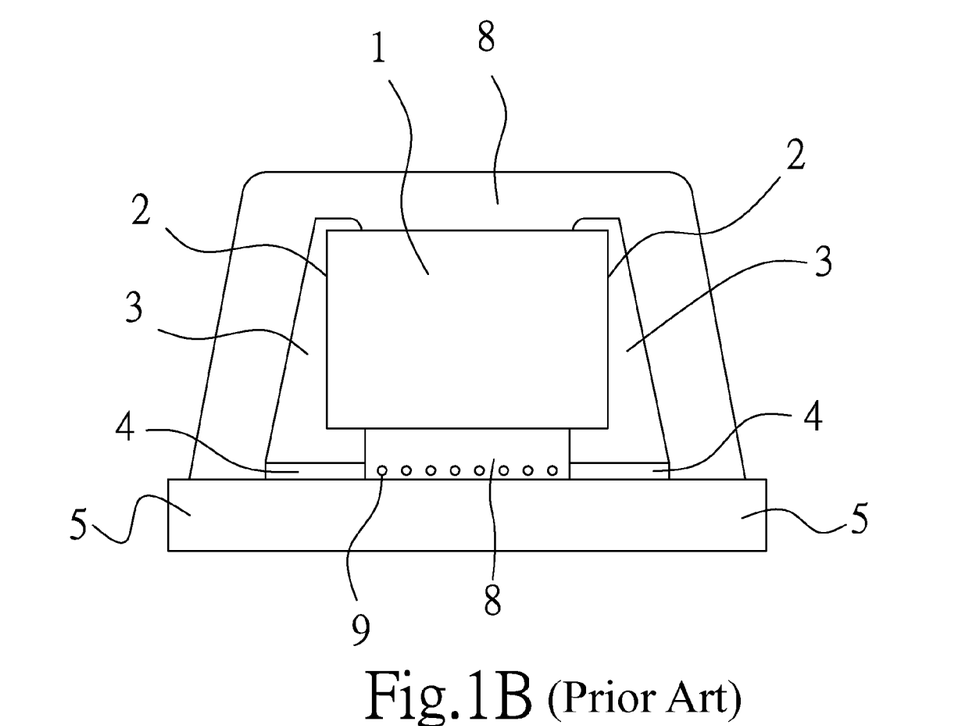
FIG. 1B illustrates another perspective view of Sn bridging issue.

Generally, the solder material used in interior device of module package, such as QFN (Quad Flat No leads), QFP (Quad Flat Package), DIP (Dual In Line Package), BGA (Ball Grid Array) and LGA (Land Grid Array), mainly comprises Sn, such as SA, SAC and Sn—Zn. However, refer to FIG. 1A (Sn electrode 2, solder material: Sn 3, solder pad 4, PCB (printed circuit board) 5), solder material (Sn) 3 connecting interior device 1 to PCB (printed circuit board) 5 in module package is easily re-molten to cause two adjacent electrodes shorted by the Sn bridging 6 from one electrode to another in the second reflow process, and thereby a product failure will occur. In order to describe the Sn bridging 6 in detail, please refer to FIG. 1B. In the process of plastic-molding, the molding material 8 is usually EMC (epoxy molding compound), resin or other suitable material. However, it isn't effective to use molding material 8 to completely fill vacancy in the bottom of the device 1, and some voids 9 are then formed underneath the device 1. The solder material (Sn) 3 will enter into the voids 9 during the second reflow process, and then the Sn bridging 6 will occur.

Therefore, what is needed is a solution to resolve the Sn bridging issue inside a package structure during a reflow process in order to increase the product quality.

SUMMARY OF THE INVENTION

One objective of the present invention is to provide a package structure with an overlaying metallic material over a solder material to prevent bridging between electrodes by the solder material during a reflow process. The package structure includes a substrate which comprises a first solder pad and a second solder pad thereon and a conductive element which has a top surface, a bottom surface, a first lateral surface and a second lateral surface. The conductive element is on the substrate, and the conductive element includes: a first electrode which is configured from a first portion of the bottom surface, via a portion of a first lateral surface, to a first portion of the top surface; and a second electrode which is configured from a second portion of the bottom surface, via a portion of a second lateral surface, to a second portion of the top surface. A solder material electrically connects the first solder pad and the second solder pad to the first electrode and the second electrode respectively. An overlaying metallic material overlays the exposed areas of the solder material, the first solder pad, the second solder pad, the first electrode and the second electrode, wherein the exposed areas comprises metallic material having a lower melting point than the overlaying metallic material, The solder material is a different metallic material from the overlaying metallic material.

In one embodiment, the solder material completely overlays the first solder pad, the second solder pad, the first electrode and the second electrode. After conductive elements are soldered on the substrate by using the solder material, the overlaying metallic material, such as Cu, overlays the solder material, such as Sn. Then, an alloy phase is formed in the interface between the solder material and the overlaying metallic material in the second reflow process. The melting point of the alloy phase is higher than that of the solder material; the solder material can not flow past the overlaying metallic material in the second reflow process, and thereby preventing the Sn bridging between electrodes.

Another objective of the present invention is to provide a method for manufacturing a package structure with an overlaying metallic material on a solder material. Firstly, provide a substrate which includes a first solder pad and a second solder pad thereon. Then, place a conductive element on the substrate, wherein the conductive element has a top surface, a bottom surface, a first lateral surface and a second lateral surface, a first electrode and a second electrode, wherein the first electrode is configured from a first portion of the bottom surface, via a portion of a first lateral surface, to a first portion of the top surface, and the second electrode is configured from a second portion of the bottom surface, via a portion of a second lateral surface, to a second portion of the top surface. Afterwards, use a solder material to electrically connect the first solder pad and the second solder pad to the first electrode and the second electrode respectively; and then use an overlaying metallic material to overlay the exposed areas of the solder material, the first solder pad, the second solder pad, the first electrode and the second electrode, wherein the exposed areas comprises metallic material having a lower melting point than the overlaying metallic material, The solder material is a different metallic material from the overlaying metallic material.

In one embodiment, the technology of using the overlaying metallic material to overlay the surface of the solder material is preferably chemical-plating (electroless plating). In a preferred embodiment, the solder material completely overlays the first solder pad, the second solder pad, the first electrode and the second electrode. In the second reflow process, the solder material and the overlaying metallic material are combined (eutectic) to form an alloy phase in the interface between the solder material and the overlaying metallic material. In one embodiment, the operating temperature of the second reflow process is between the melting point of the solder material and the melting point of the overlaying metallic material.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as following. The described preferred embodiments are presented for purposes of illustrations and description and they are not intended to limit the scope of the present invention.

Figure 2:
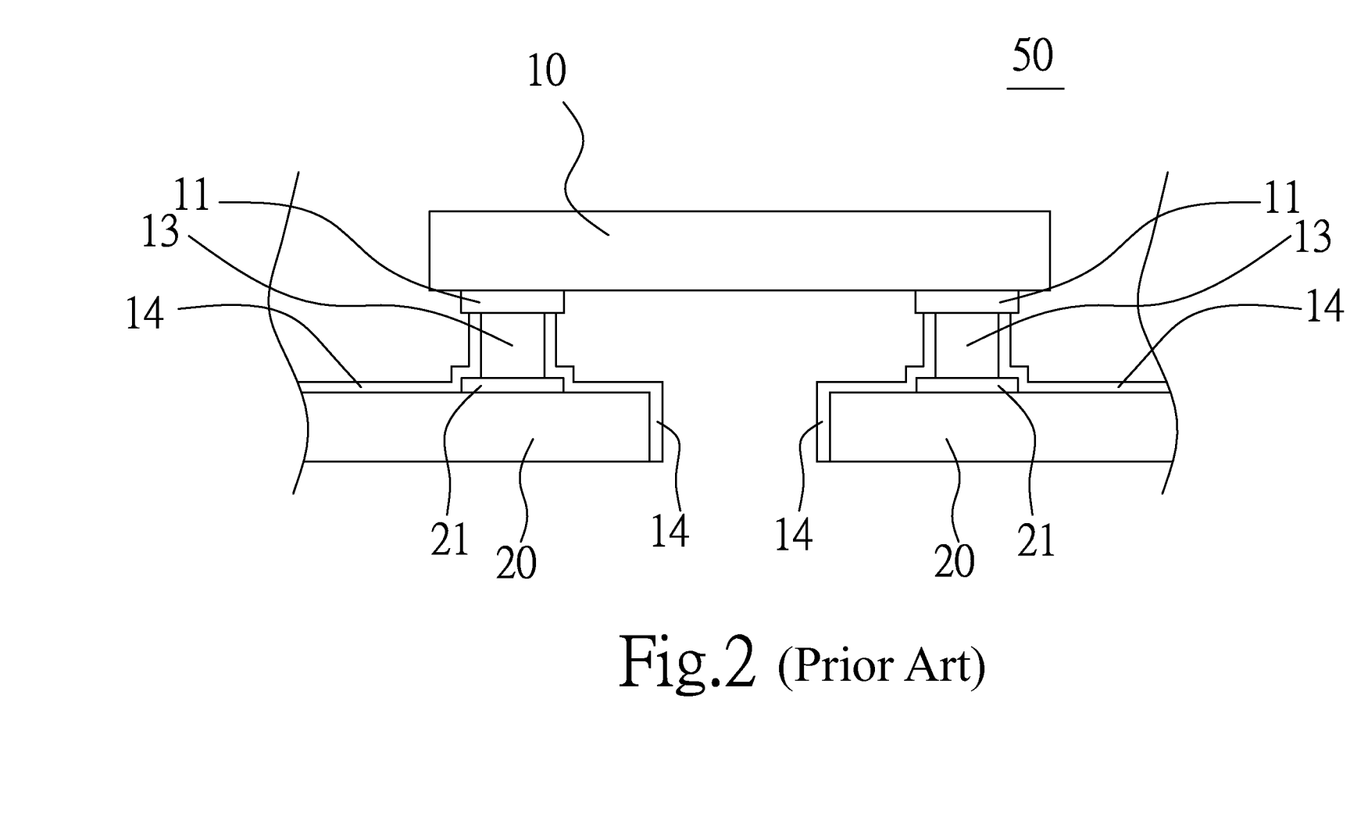
FIG. 2 illustrates a semiconductor package with an enhancing layer.

A typical package structure is described herein. Please refer to FIG. 2. A semiconductor package 50 with an enhancing layer 14 is illustrated. The enhancing layer is used to enhance the mechanical strength of the bumps between the IC chip and the lead frame to prevent bumps from collapsing at high temperature in a reflow process. The semiconductor package 50 includes a lead frame 20, an IC chip 10, several bumps 13, and an enhancing layer 14. The lead frame 20 includes several leads 21, and several bonding pads 11 are disposed on the surface of the IC chip 10. The bumps 13 connect the bonding pads 11 of the chip 10 to the leads 21 of the lead frame 20, wherein the bumps 13 are composed of Sn, Cu, Pb or Ag. The enhancing layer 14 overlays the leads 21 and the bumps 13. The enhancing layer 14 is made of metal and preferably a continuous metal layer, such as Cu. The melting point of the enhancing layer 14 is higher than that of the melting point of the bumps 13. The enhancing layer 14 can be formed by electroplating.

The invention discloses a package structure with an overlaying metallic material over a solder material in order to resolve a Sn bridging issue. A solder material connects a conductive element to a substrate, and an overlaying metallic material mainly overlays the surface of the solder material. The conductive element can be MOSFET, IGBT, diode, resistor, choke or capacitor. The electrodes of the conductive element can be configured in one embodiment as: each of the electrodes is extending from a portion of the top surface of the conductive element to a portion of the bottom surface of the conductive element through a portion of a lateral surface of the conductive element, wherein a solder material overlays the portion of the top surface, the portion of the bottom surface and the portion of the lateral surface of the conductive element in a soldering process. The substrate has a plurality of solder pads and is preferably a PCB (printed circuit board). But the substrate is not limited to PCB (printed circuit board).

Figure 3:
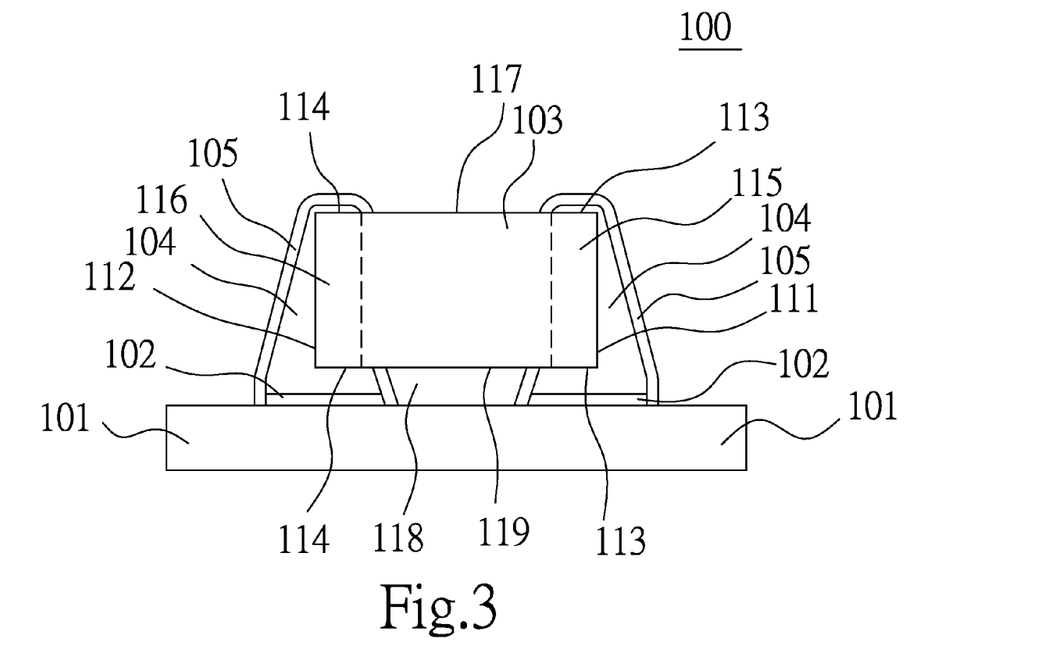
FIG. 3 illustrates a cross-sectional view of the package structure in the present invention.

FIG. 3 illustrates a cross-sectional view of the package structure 100 in the present invention. The structure 100 includes a PCB (printed circuit board) 101, a plurality of solder pads 102, a conductive element 103, a solder material 104 and an overlaying metallic material 105.

A PCB (printed circuit board) 101 has a plurality of solder pads 102 thereon. The solder pads 102 can be made of any suitable metallic material, such as Sn, Pb, Zn, Ag or a combination thereof. A conductive element 103 is disposed on the PCB (printed circuit board) 101 by soldering in reflow process. The conductive element 103 can be MOSFET, IGBT, diode, resistor, choke or capacitor. The conductive element 103 has at least two electrodes.

Figure 4A:
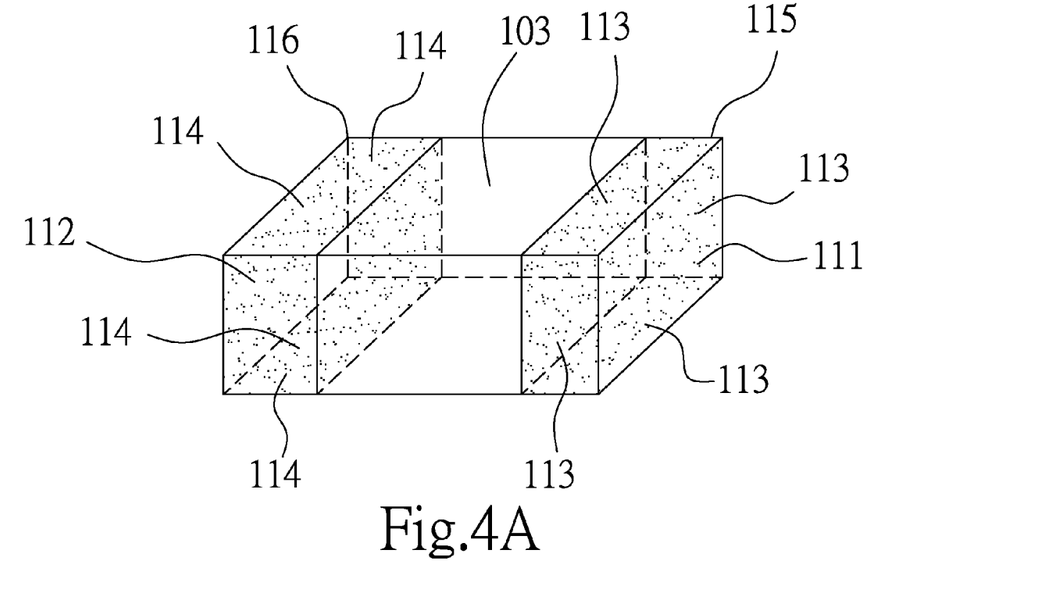
FIG. 4A further illustrates a perspective view of the conductive element and the electrode.

FIG. 4A further illustrates a perspective view of the conductive element 103 and the electrode 115, 116. In one embodiment, the conductive element 103 has two electrodes: a first electrode 115 which includes a first lateral surface 111 and a first region 113 adjacent to the first lateral surface 111; and a second electrode 116 which includes a second lateral surface 112 and a second region 114 adjacent to the second lateral surface 112.

Figure 4B:
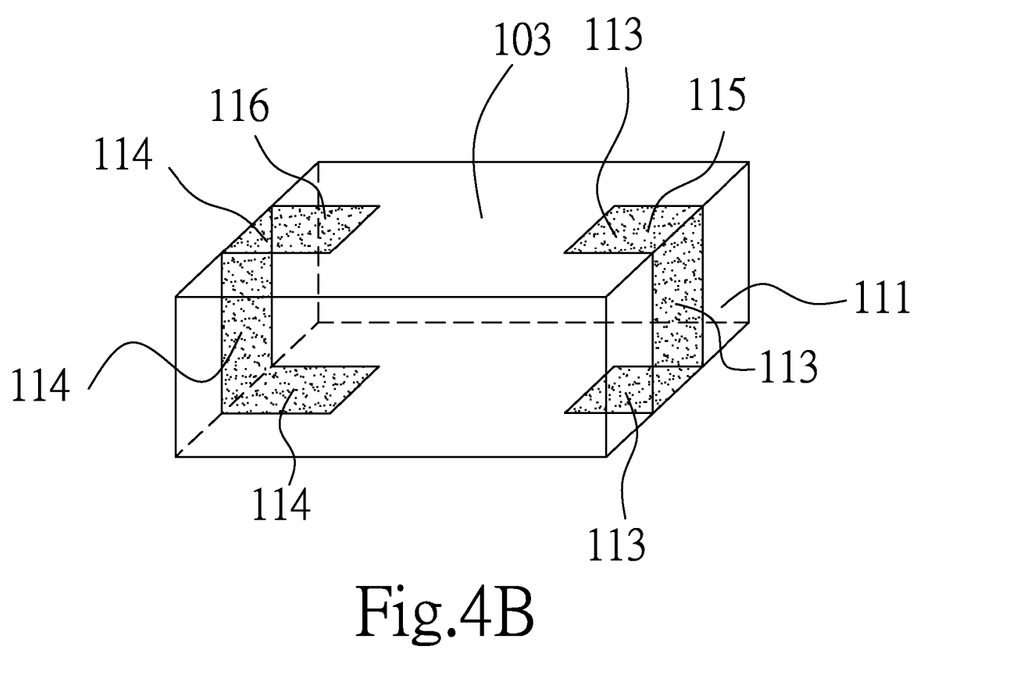
FIG. 4B further illustrates another perspective view of the conductive element and the electrode.

The configuration of the electrode 115, 116 can be on a portion of a first lateral surface 111 and a second region 114 of the conductive element 103. FIG. 4B further illustrates another perspective view of the conductive element 103 and the electrode 115, 116. In one embodiment, the conductive element 103 has two electrodes: a first electrode 115 which includes a portion of a first lateral surface 111 and a first region 113 adjacent to the portion of the first lateral surface 111; and a second electrode 116 which includes a portion of a second lateral surface 112 and a second region 114 adjacent to the portion of the second lateral surface 112.

Please refer to FIG. 4A and FIG. 4B again. A portion of the first electrode 115 and a portion of the second electrode 116 are disposed on opposite lateral surfaces of the conductive element 103. In other words, the first electrode 115 is configured from a first portion of the bottom surface, via a portion of the first lateral surface, to a first portion of the top surface; and the second electrode 116 is configured from a second portion of the bottom surface, via a portion of the second lateral surface, to a second portion of the top surface. In one embodiment, the material used in the electrodes 115, 116 is Sn.

Please refer back to FIG. 3; a solder material 104 electrically connects the electrodes 115, 116 to the solder pads 102. In a preferred embodiment, a solder material 104 completely overlays the electrodes 115, 116 and the solder pads 102. The solder material 104 overlays a portion of the first lateral surface 111, the first region 113, a portion of the second lateral surface 112, the second region 114. In other words, the solder material 104 further overlays a portion of the top surface 117 and a portion of the bottom surface 119 of the conductive element 103. The solder material 104 can be any suitable metallic material, such as Sn, Pb, Zn, Ag or a combination thereof, and is preferably Sn.

The solder material 104 may not completely overlays the electrodes 115, 116 and the solder pads 102. In one embodiment, an overlaying metallic material 105 can overlay the exposed areas of the electrodes 115, 116 and the solder material 104, wherein the exposed areas comprise metallic material having a lower melting point than the overlaying metallic material. The overlaying metallic material 105 and each of the overlaid portions 104, 115, 116 are combined to form an alloy phase in the interface between the overlaying metallic material 105 and each of the overlaid portions 104, 115, 116. The alloy phase is a protective layer, and it prevents each of the overlaid portions 104, 115, 116 from flowing past the overlaying metallic material 105 during a reflow process. The melting point of the alloy phase is higher than that of each of the portions (the electrodes 115, 116 and the solder material 104).

In one embodiment, an overlaying metallic material 105 can overlay the exposed areas of the electrodes 115, 116, the solder pads 102 and the solder material 104, wherein the exposed areas comprise metallic material having a lower melting point than the overlaying metallic material. The overlaying metallic material 105 and each of the overlaid portions 102, 104, 115, 116 are combined to form an alloy phase in the interface between the overlaying metallic material 105 and each of the overlaid portions 102, 104, 115, 116. The alloy phase is a protective layer, and it prevents each of the overlaid portions 102, 104, 115, 116 from flowing past the overlaying metallic material 105 during a reflow process. The melting point of the alloy phase is higher than that of each of the portions (the electrodes 115, 116, the solder pads 102 and the solder material 104).

In one embodiment, the solder material is made of Sn, and the overlaying metallic material is made of Cu. In one embodiment, the solder material is made of Sn; the overlaying metallic material is made of Cu; the first solder pad, the second solder pad, the first electrode and the second electrode are also made of Sn.

In a preferred embodiment, the solder material 104 completely overlays the electrodes 115, 116 and the solder pads 102, and the overlaying metallic material 105 completely overlays the surface of the solder material 104. The melting point of the overlaying metallic material 105 is higher than that of the solder material 104, and the solder material 104 and the overlaying metallic material 105 are combined (eutectic) to form an alloy phase in the interface between the solder material 104 and the overlaying metallic material 105. In a preferred embodiment, the solder material 104 can be made of Sn, the overlaying metallic material 105 can be made of Cu, and the alloy phase can be Cu alloy, such as $Cu_3Sn$. The melting point of the alloy phase is higher than that of the solder material 104. In one example, an initial alloy phase $Cu_6Sn_5$ appears first, and then a final alloy phase $Cu_3Sn$ appears after more Cu diffuses into the initial alloy phase $Cu_6Sn_5$. The alloy phase is a protective layer, so it prevents the solder material 104 (Sn) from flowing past the overlaying metallic material 105 (Cu) in the second reflow process with operating temperature between the two melting points. Thereby, it prevents the solder material 104 (Sn) from bridging between two electrodes 115, 116.

Figure 5:
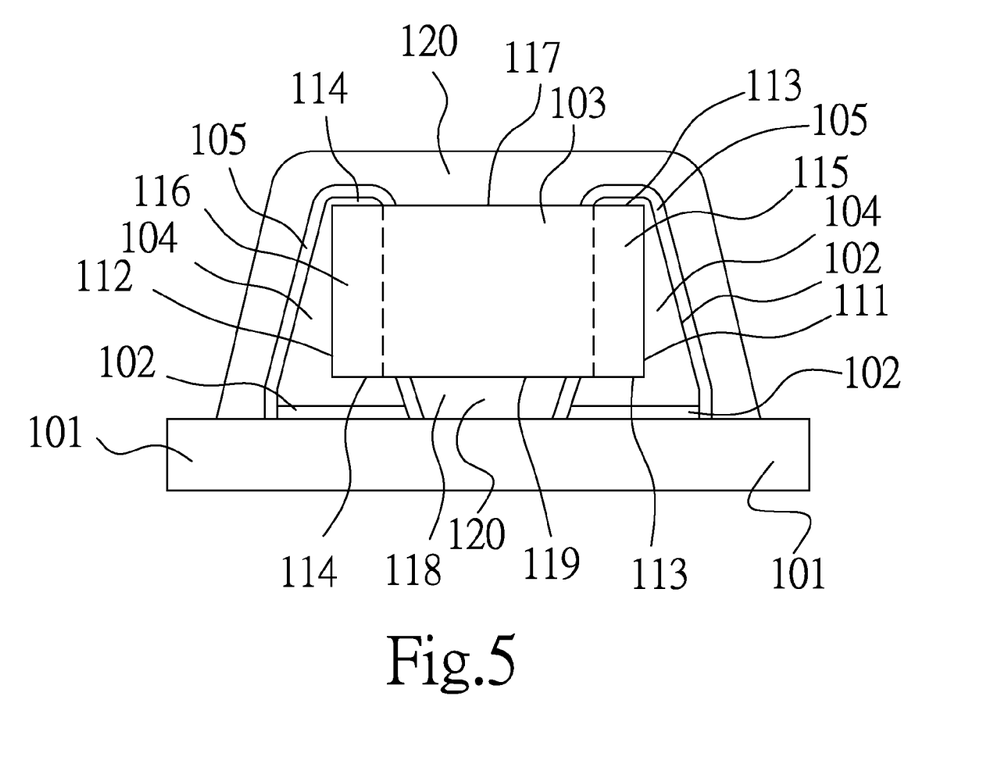
FIG. 5 illustrates a cross-sectional view of the package structure after molding.

FIG. 5 illustrates a cross-sectional view of the package structure 100 after molding. Before molding, a thin vacancy 118 (in FIG. 3) exists in the interior of the package structure 100 below the conductive element 103. The vacancy 118 is filled with a molding material 120, such as resin. The molding material 120 also overlays the conductive element 103, the solder material 104 and the overlaying metallic material 105.

Figure 6:
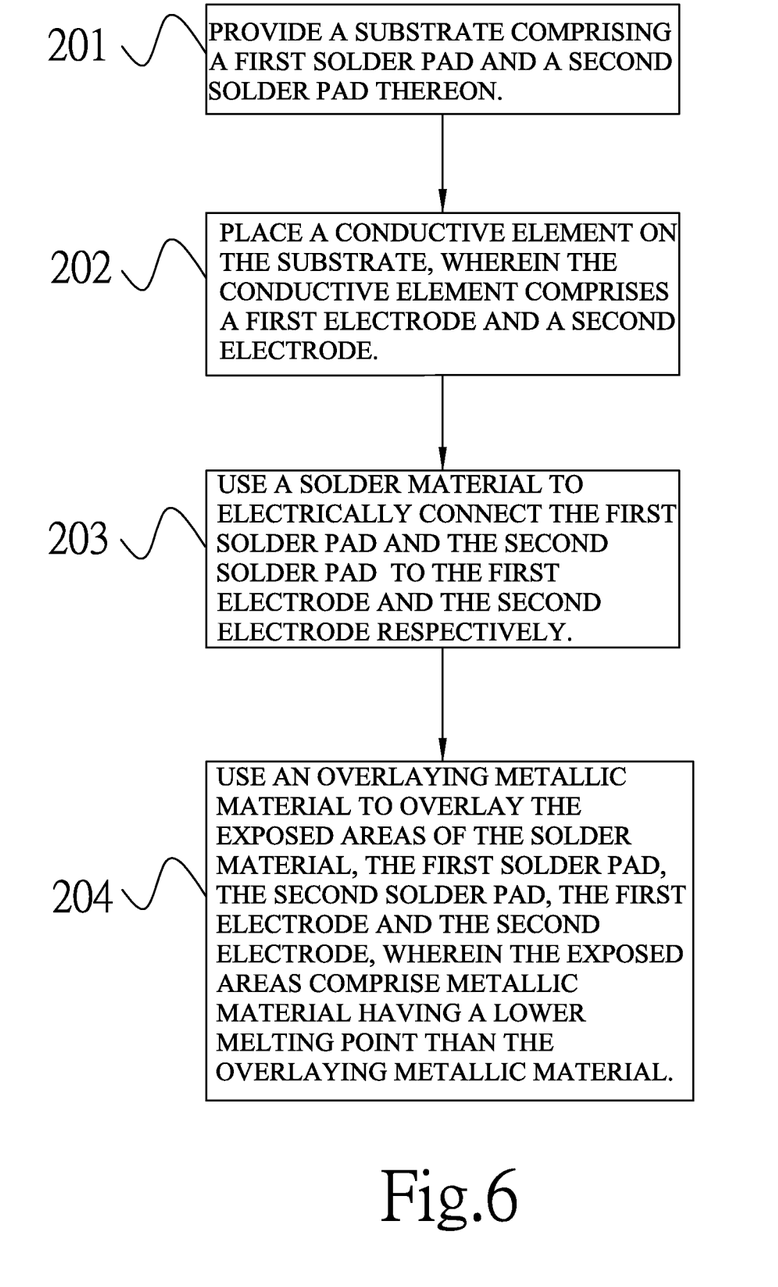
FIG. 6 is a process flow of manufacturing the package structure.

FIG. 6 is the process flow of manufacturing the package structure 100.

In step 201, provide a substrate 101 comprising a first solder pad 102 and a second solder pad 102 thereon. The substrate can be preferably a PCB (printed circuit board).

In step 202, place a conductive element 103 on the substrate, wherein the conductive element 103 comprises a first electrode 115 and a second electrode 116. The configuration of first electrode 115 and a second electrode 116 has been described in FIG. 4A or FIG. 4B.

In step 203, use a solder material 104 to electrically connect the first solder pad 102 and the second solder pad 102 to the first electrode 115 and the second electrode 116 respectively. The step 203 is carried out in the first reflow process.

In step 204, use an overlaying metallic material 105 to overlay the exposed areas of the solder material 104, the first solder pad 102, the second solder pad 102, the first electrode 115 and the second electrode 116, wherein the exposed areas comprise metallic material having a lower melting point than the overlaying metallic material 105. The overlaying metallic material 105 and each of the overlaid portions 102, 104, 115, 116 are combined to form an alloy phase in the interface between the overlaying metallic material 105 and each of the overlaid portions 102, 104, 115, 116. The alloy phase is a protective layer, and it prevents each of the overlaid portions 102, 104, 115, 116 from flowing past the overlaying metallic material 105.

In a preferred embodiment, the solder material 104 completely overlays the electrodes 115, 116 and the solder pads 102, and the overlaying metallic material 105 completely overlays the surface of the solder material 104. The solder material 104 and the overlaying metallic material 105 are combined to form an alloy phase in the interface between the solder material 104 and the overlaying metallic material 105. The alloy phase is a protective layer, and it prevents the solder material 104 from flowing past the overlaying metallic material 105.

Step 204 can be carried out by known techniques, such as electroplating or chemical-plating (electroless plating), preferably chemical-plating (electroless plating). Because the solution used in chemical-plating (electroless plating) can easily flow into the thin vacancy 118 in the interior of the package structure 100, reaction uniformity can be easily controlled. In one embodiment, an oxide layer on the exposed areas of the solder material 104, the first solder pad 102, the second solder pad 102, the first electrode 115 and the second electrode 116 can be removed before chemical-plating (electroless plating) to improve chemical-plating (electroless plating) performance, such as stronger adhesion force between the overlaying metallic material and the exposed areas, avoidance of voids in the interface between the overlaying metallic material and the exposed areas, and so on. Then, overlay the conductive element 103, the solder material 104 and the overlaying metallic material 105 with a molding material 120. In the second reflow process, the solder material 104 and the overlaying metallic material 105 are combined (eutectic) to form an alloy phase in the interface between the solder material 104 and the overlaying metallic material 105. In one embodiment, the operating temperature of the second reflow process is between the melting point of the solder material 104 and the melting point of the overlaying metallic material 105. Because the melting point of the overlaying metallic material 105 is higher than the melting point of the solder material 104, the alloy phase has a melting point higher than the solder material.

In a preferred embodiment, the solder material 104 can be made of Sn, the overlaying metallic material 105 can be made of Cu, and the alloy phase can be Cu alloy, such as $Cu_3Sn$. In one example, an initial alloy phase $Cu_6Sn_5$ appears first, and then a final alloy phase $Cu_3Sn$ is formed after more Cu diffuses into the initial alloy phase $Cu_6Sn_5$. The alloy phase is a protective layer, so it prevents the solder material 104 (Sn) from flowing past the overlaying metallic material 105 (Cu) in the second reflow process (reflow temperature is less than 300° C.). Accordingly, the solder material 104 (Sn) bridging issue can be solved.

It follows from description of the above embodiments that the structure in the present invention and the method for manufacturing the same can provide a solution to avoid the Sn bridging issue to assure product quality.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A package structure, comprising:
   a substrate comprising a first solder pad and a second solder pad thereon;
   a conductive element on the substrate, wherein the conductive element has a body comprising an outer surface including a top surface, a bottom surface, a first lateral surface and a second lateral surface, wherein the conductive element comprises a first electrode and a second electrode, wherein the first electrode is disposed on a first portion of the outer surface and configured from a first portion of the bottom surface, via a portion of the first lateral surface, to a first portion of the top surface, and the second electrode is disposed on a second portion of the outer surface and configured from a second portion of the bottom surface, via a portion of the second lateral surface, to a second portion of the top surface;

a first metallic material overlaying on the first electrode and the second electrode, wherein the first metallic material is in contact with the first solder pad and the second solder pad to electrically connect the first solder pad and the second solder pad to the first electrode and the second electrode, respectively;

a second metallic material overlaying on the first metallic material, wherein a first and a second portion of the second metallic material extend respectively from a third and a fourth portion of the bottom surface of the body of the conductive element to the substrate, wherein the third and the fourth portion of the bottom surface are between the first and the second portion of the bottom surface of the body of the conductive element; and the first metallic material has a lower melting point than the second metallic material.

2. The package structure according to claim 1, wherein the second metallic material and the first metallic material are combined to form an alloy phase in an interface between the second metallic material and the first metallic material.

3. The package structure according to claim 1, wherein the first metallic material extends from the top surface to the bottom surface through said lateral surfaces of the body of the conductive element, wherein a third and a fourth portion of the second metallic material respectively extend from the top surface of the body of the conductive element to the substrate.

4. The package structure according to claim 1, further comprising: a molding material overlaying the conductive element, the first metallic material and the second metallic material.

5. The package structure according to claim 2, wherein the first metallic material is made of Sn, and the second metallic material is made of Cu.

6. The package structure according to claim 5, wherein the first solder pad, the second solder pad, the first electrode and the second electrode are made of Sn.

7. The package structure according to claim 6, wherein the alloy phase comprises $Cu_3Sn$.

8. The package structure according to claim 1, wherein the substrate is a PCB.

9. The package structure according to claim 1, wherein the conductive element comprises at least one of MOSFET, IGBT, diode, resistor, choke or capacitor.

10. The package structure according to claim 4, further comprising a vacancy below the conductive element, wherein the vacancy is filled with the molding material.

11. The package structure according to claim 8, wherein the first metallic material is made of Sn, the second metallic material is made of Cu, and the alloy phase comprises $Cu_3Sn$.

12. A package structure, comprising:
a substrate comprising a first solder pad and a second solder pad thereon;
an electronic device on the substrate, wherein the electronic device has a body comprising an outer surface including a top surface, a bottom surface, a first lateral surface and a second lateral surface, wherein the electronic device comprises a first electrode and a second electrode, wherein the first electrode is disposed on a first portion of the outer surface and configured from a first portion of the bottom surface, via a portion of the first lateral surface, to a first portion of the top surface, and the second electrode is disposed on a second portion of the outer surface and configured from a second portion of the bottom surface, via a portion of the second lateral surface, to a second portion of the top surface;
a first metallic material overlaying on the first electrode and the second electrode, wherein the first metallic material is in contact with the first solder pad and the second solder pad to electrically connect the first solder pad and the second solder pad to the first electrode and the second electrode, respectively;
a second metallic material overlaying on the first metallic material, wherein a first and a second portion of the second metallic material extend respectively from a third and a fourth portion of the bottom surface of the body of the electronic device to the substrate, wherein the third and the fourth portion of the bottom surface are between the first and the second portion of the bottom surface of the body of the electronic device; and the first metallic material has a lower melting point than the second metallic material.

* * * * *